(12) United States Patent
Takahashi

(10) Patent No.: US 7,008,520 B2
(45) Date of Patent: Mar. 7, 2006

(54) SPUTTERING DEVICE

(75) Inventor: Nobuyuki Takahashi, Sagamihara (JP)

(73) Assignee: CYG Corporation, Kanagawa (JP)

( * ) Notice: Subject to any disclaimer, the term of this patent is extended or adjusted under 35 U.S.C. 154(b) by 263 days.

(21) Appl. No.: 10/648,330

(22) Filed: Aug. 27, 2003

(65) Prior Publication Data

US 2004/0231980 A1 Nov. 25, 2004

(30) Foreign Application Priority Data

May 14, 2003 (JP) ............................. 2003-135242

(51) Int. Cl.
*C23C 14/35* (2006.01)
(52) U.S. Cl. ............... 204/298.11; 204/298.2; 204/298.26; 204/298.28
(58) Field of Classification Search ........... 204/298.06, 204/298.26, 298.28, 298.11, 298.2
See application file for complete search history.

(56) References Cited

U.S. PATENT DOCUMENTS 6,042,706 A * 3/2000 Fu ..................... 204/298.12
6,533,906 B1 * 3/2003 Kawakubo et al. .... 204/192.22

* cited by examiner

*Primary Examiner*—Steven VerSteeg
(74) *Attorney, Agent, or Firm*—Wenderoth, Lind & Ponack, L.L.P.

(57) ABSTRACT

An object of the invention is to provide a sputtering device which can provide increased distribution of film formation and coverage distribution better than prior sputtering devices. Thus, this invention is that, in the sputtering device constituted of a substrate holder for holding a substrate, at least one target for forming a thin film on the substrate, at least one sputtering cathode which has the target and magnets arranged behind the substrate, an axis of the target is inclined to an axis of the sputtering cathode, and the sputtering cathode is rotated on its axis to make the target swing relative to the substrate.

21 Claims, 3 Drawing Sheets

SPUTTERING DEVICE

BACKGROUND OF THE INVENTION

This invention relates to a sputtering device which is provided with a target for forming a thin film on a substrate and in which ionized gas is collided to the substrate to sputter atoms or molecules of the target so that these atoms or molecules are clung on the substrate to form the thin film on the substrate.

A method for forming a sputter film disclosed in JP 2000-303172 A is characterized by moving a substrate at a specific speed in a sputtering chamber, locating a pair of targets on both sides of a perpendicular direction to a movement of the substrate and arranging a pair of targets slantly to a surface of the substrate in a face-to-face condition in the substrate respectively.

Active sputtering device disclosed in JP 2001-107228 A is to incline both sides' cathodes of three magnetron cathodes to an inner direction and to sputter.

A sputtering device for a magnetic thin film disclosed in JP 2002-20864 A is to arrange a substrate and a target so that sputtering particles are entered slantly to the substrate, and to form a magnetic thin film with a high anisotropic rate more evenly by rotating the substrate on its axis. Concretely, three distribution adjusting plates are arranged between three circular targets and a circular substrate, and a rotational center of the rotating substrate and a center of the targets are offset with a specific distance to enter sputtering articles from the target slantly to the substrate.

A device for forming film disclosed in JP 2003-13217 A is provided with a shutter which can open and shut at specific intervals in order to carry out a film formation process by a sputtering cathode and an oxidizing process by a plasma source intermittently at specific cycles in a condition such as to hold a relative position between the sputtering cathode for forming a metal film and a substrate of the plasma source for oxidizing.

However, in the sputtering device as described in the above mentioned patent documents, because an angle of incidence of atoms or molecules sputtered from the target to the substrate is constant, a constant characteristic is arisen in distribution of film formation and coverage distribution on the substrate, and as a result, when more precise evenness is required, it is a problem to be able to achieve the requirement.

SUMMARY OF THE INVENTION

An object of the invention is to provide a sputtering device in which distribution of film formation and coverage distribution are increased more than ones of prior sputtering devices.

Accordingly, the invention is, in a sputtering device comprising a substrate holder for holding a substrate, at least one target for forming a thin film on the substrate, at least one sputtering cathode in which the target is installed, and magnets located behind the target, that an axis of the target inclines to an axis of the sputtering cathode, the sputtering cathode is rotated on its axis to swing the target to the substrate.

Besides, it is preferred that the magnet is rotated on its axis to the target.

Furthermore, it is preferred that a plurality of the sputtering cathodes are arranged relative to the substrate.

Moreover, a shutter is arranged between the sputtering cathodes and the substrate selectively to open or close one or more of the plural sputtering cathodes.

Furthermore, it is preferred that the plurality of the sputtering cathodes can rotate with a center of the substrate as the axis. Besides, it is preferred that the substrate holder is rotated on its axis.

Moreover, it is preferred that a protection shield for preventing clinging a film from a neighborhood and a side surface of the substrate holder is provided at a circumferential edge of the substrate holder, and further that the protection shield can be rotate along the circumferential edge of the substrate holder.

BRIEF DESCRIPTION OF DRAWINGS

The various features of novelty which characterize the invention are pointed out with particularity in the claims annexed to and forming a part of this specification. For a better understanding of the invention, its operating advantages, and specific objects attained by its use, reference should be had to the accompanying drawings and descriptive matters in which there are illustrated and described preferred working modes of the invention:

DETAILED DESCRIPTION OF THE PREFERRED WORKING MODE

Hereinafter, working modes in this invention are explained with reference to drawings.

Figure 1:
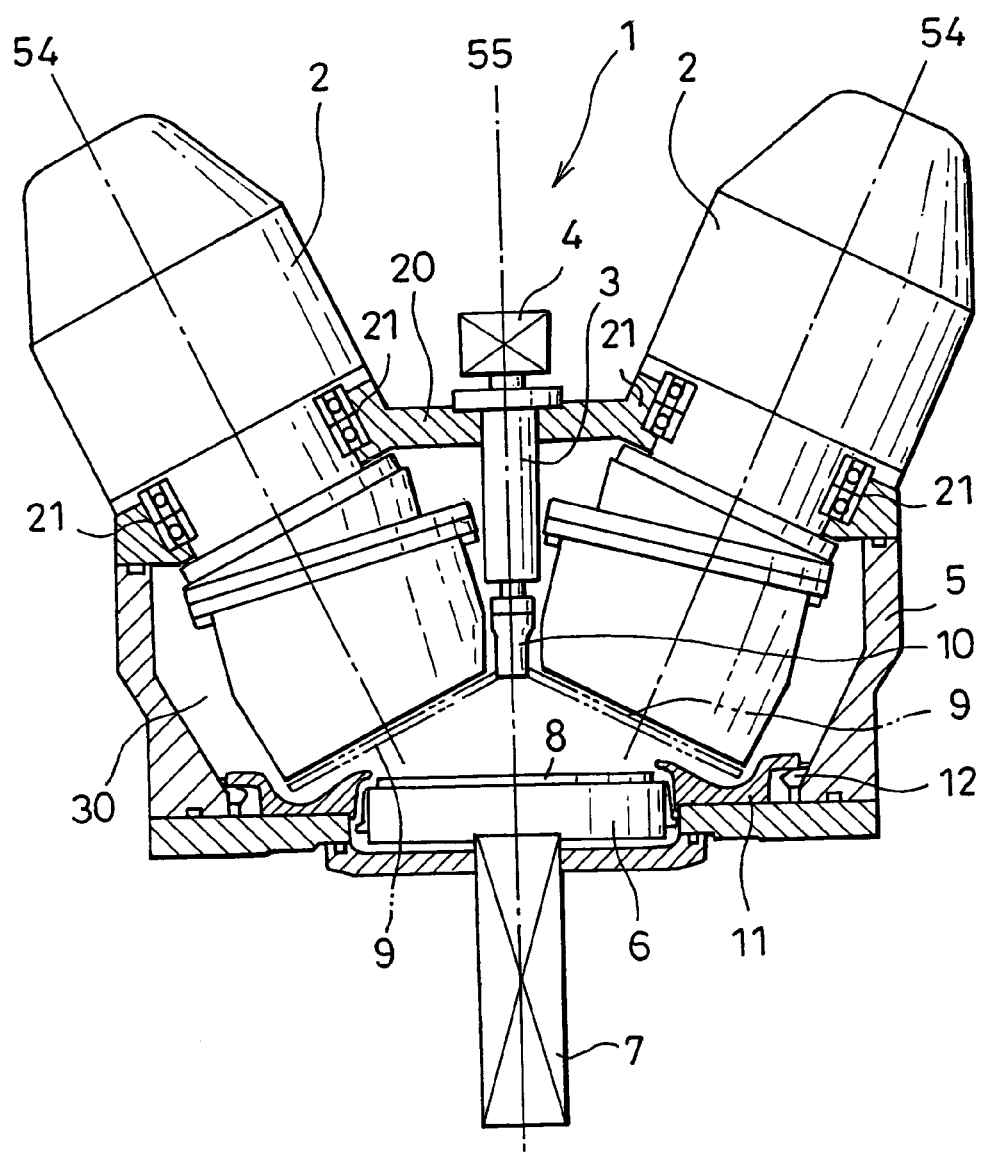
FIG. 1 is a general view of a sputtering device according to a working mode of the present invention.

FIG. 1 shows one embodiment of a sputtering device according to a preferred working mode of the present invention. In the FIG. 1, the sputtering device is constituted of at least a case portion 5 and an upper case portion 20 which define a vacuum chamber 30, a substrate holder 6 for holding a substrate 8 in the vacuum chamber 30, and a plurality of sputtering cathodes 2 which sputter to the substrate 8 and each of which has an axis 54 inclined to an axis 55 of the substrate holder 6.

Besides, it is preferred to be provided with a shutter 9 between the sputtering cathodes 2 and the substrate 8 to open and close front sides of the sputtering cathodes 2 and further to carry out a pre-sputtering. It is preferred that the shutter 9 is rotated by a rotation shaft 10 located on the axis 55 of the substrate holder 6. It is preferred that the sputtering device 1 is provided with a holder 3 for holding the rotation shaft 10 rotatably and a driving unit 4 for rotating the rotation shaft 10.

The sputtering cathode 2 is held rotatably via a bearing 21 between the case portion 5 and the upper case portion 20 to be able to rotate around the axis 54. Further, the substrate holder 6 can be rotated on its axis by a substrate driving unit 7.

Furthermore, a circular protection shield 11 is provided on the circumferential edge portion of the substrate holder 6 so as to surround the substrate holder 6 to prevent forming a clinging film in a gap between the circumferential edge of the substrate holder 6 and the case portion 5, so that the substrate holder 8 is rotated on its axis smoothly. Moreover, the protection shield 11 is rotated by a driving means such as rotation gear 12 to cling a sputtered film evenly so that peeling of a sputtered film formed on the protection shield 11 is prevented. Further, a means for adjusting temperature is provided on the protection shield to prevent peeling of the sputtered film by changing temperature. Supply of heat by a heater, cooling by cooling water and so on is considered as the means for adjusting temperature.

Figure 2:
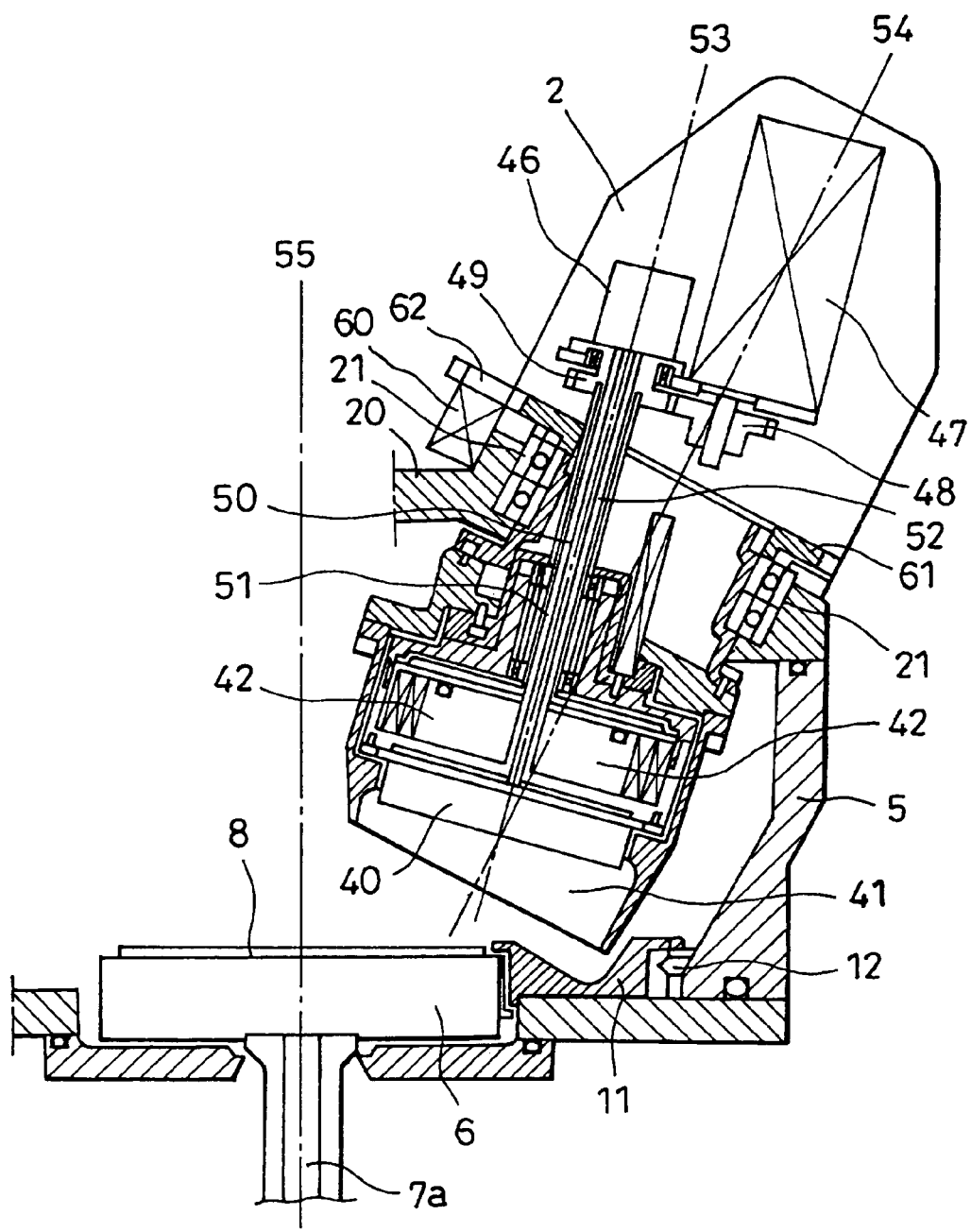
FIG. 2 is an explanatory view of sputtering cathodes according to a working mode of the present invention.

Each of the sputtering cathodes 2 is, as shown in FIG. 2, provided with a target 40 having an axis 53 which is inclined at a specific angle (approximately 5°–17.5°, especially 11.25° in this working mode) to an axis 54 of the sputtering cathode 2, and magnets 42 arranged behind the target 40 and generating a rotational magnetic field on a surface of the target 40. Furthermore, a nozzle shaped shield portion 41 is formed around the target 40 of the sputtering cathode 2.

A shaft portion 50 arranged along the axis 53 is constituted of a supporting shaft 51 for holding the target 40 and a driving shaft 52 for rotating the magnets 42, wherein cooling water is supplied from a cooling water supply unit 46 to a space in the support shaft 51 and between the supporting shaft 51 and the driving shaft 52 to cool down the target 40. The driving shaft 52 is rotated via gears 48 and 49 by a rotation driving device 47 of the magnets 42 to rotate magnets 42 around the axis 53. Besides, the sputtering cathode 2 is rotated around the axis 54 by a gear 62 rotated by a sputtering cathode driving device 60 via a gear 61 formed around the sputtering cathode 2. Note that 7a shows a rotation shaft of the substrate holder 6.

Figure 3:
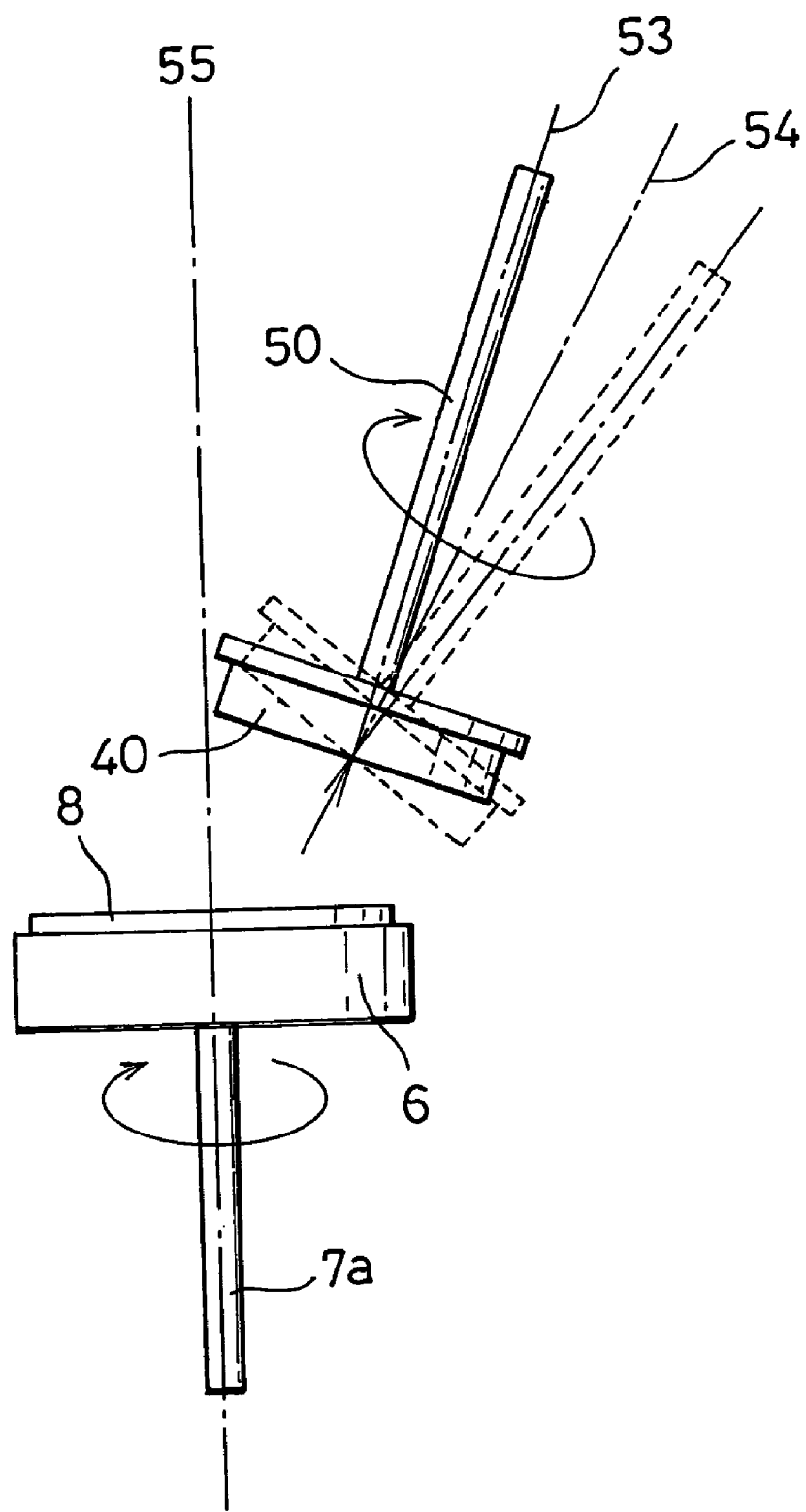
FIG. 3 is an explanatory view for explaining a diagram of the invention.

In the sputtering device 1 with the above mentioned constitution, as shown in FIG. 3, the axis 53 extending vertically from a center of the target 40 to the substrate 8 is rotated in a condition such as to incline at the specific angle to the axis 54 of the sputtering cathode 2, and as a result, the target is swung three-dimensionally to the substrate 8. Concretely, the target 40 is swung regularly from a position inclined gently to the substrate 8 to a position inclined largely to the substrate 8 and from a position facing backward of rotation of the substrate 8 to a position facing forward of the rotation of the substrate 8.

Thus, Atoms or molecules radiated from the target 40 are poured on the substrate 8 at different angles of incidence to spread all over the substrate 8. Furthermore, in the case that the substrate 8 has small holes, it is possible to sputter to the small holes at various angles, so that a film is formed in an inner surface of each small hole evenly. Moreover, in the case of the substrate 8 having dents or projections, it is possible to form the film evenly thereon.

Besides, the substrate holder 6 is rotated in this working mode, but it is preferred that the sputtering cathodes 2 are revolved.

As mentioned above, this invention is characterized in that the substrate 8 and the sputtering cathodes 2 are moved relative to each other, that the target is arranged slantly to the substrate 8, and that the target is swung relative to the substrate 8.

As described above, in this invention, the target is swung relative to the substrate, so that it is possible to vary an inclination angle of the target to the substrate, as a result, it is possible to improve performance of film formation. Concretely, it is possible that the contribution is improved from ±3% in the prior distribution to ±1%. Thus, it is possible to improve the distribution of film formation and coverage distribution.

Furthermore, it is possible that variation with time of erosion shape in the target is compensated.

What is claimed is:

1. A sputtering device constituted of a substrate holder for holding a substrate, at least one target for forming a thin film on the substrate, and at least one sputtering cathode in which said target is installed, wherein:
an axis of said target is inclined to an axis of said sputtering cathode, and
said sputtering cathode is rotated on its axis to make said target swing relative to said substrate holder.

2. A sputtering device according to claim 1, wherein:
a protection shield is provided around said substrate holder to prevent forming a film clung around or beside said substrate holder.

3. A sputtering device according to claim 2, wherein:
said protection shield can be rotated along a circumferential edge of said substrate holder.

4. A sputtering device according to claim 1, wherein:
said substrate holder is rotated on its axis.

5. A sputtering device according to claim 4, wherein:
a protection shield is provided around said substrate holder to prevent forming a film clung around or beside said substrate holder.

6. A sputtering device according to claim 5, wherein:
said protection shield can be rotated along a circumferential edge of said substrate holder.

7. A sputtering device according to claim 4, wherein:
magnets are arranged behind said target and rotated on its axis.

8. A sputtering device according to claim 7, wherein:
a protection shield is provided around said substrate holder to prevent forming a film clung around or beside said substrate holder.

9. A sputtering device according to claim 8, wherein:
said protection shield can be rotated along a circumferential edge of said substrate holder.

10. A sputtering device according to claim 7, wherein:
said sputtering cathode is inclined relative to an axis of said substrate holder.

11. A sputtering device according to claim 10, wherein:
a protection shield is provided around said substrate holder to prevent forming a film clung around or beside said substrate holder.

12. A sputtering device according to claim 11, wherein:
said protection shield can be rotated along a circumferential edge of said substrate holder.

13. A sputtering device according to claim 10, wherein:
a plurality of sputtering cathodes are arranged relative to said substrate holder.

14. A sputtering device according to claim 13, wherein:
a protection shield is provided around said substrate holder to prevent forming a film clung around or beside said substrate holder.

15. A sputtering device according to claim 14, wherein:
said protection shield can be rotated along a circumferential edge of said substrate holder.

16. A sputtering device according to claim 13, wherein:
said plurality of said sputtering cathodes can be revolved around the axis of said substrate holder.

17. A sputtering device according to claim 16, wherein:
a protection shield is provided around said substrate holder to prevent forming a film clung around or beside said substrate holder.

18. A sputtering device according to claim 17, wherein:
said protection shield can be rotated along a circumferential edge of said substrate holder.

19. A sputtering device according to claim 16, wherein:
a shutter is arranged between said sputtering cathodes and said substrate holder to open and close said sputtering cathodes selectively.

20. A sputtering device according to claim 19, wherein:
a protection shield is provided around said substrate holder to prevent forming a film clung around or beside said substrate holder.

21. A sputtering device according to claim 20, wherein:
said protection shield can be rotated along a circumferential edge of said substrate holder.

* * * * *